June 29, 1965 A. SCHONFELD ET AL 3,192,443

HOUSING STRUCTURE FOR ELECTRONIC COMPONENTS

Filed April 21, 1961

INVENTORS.
ARNOLD SCHONFELD
EDWIN F. KEYSER
JOHN FEDERIGO

BY Edward M. Farrell
ATTORNEY

United States Patent Office 3,192,443

Patented June 29, 1965

3,192,443

HOUSING STRUCTURE FOR ELECTRONIC COMPONENTS

Arnold Schonfeld, Levittown, and Edwin F. Keyser and John Federigo, Philadelphia, Pa., assignors to Sperry Rand Corporation, New York, N.Y., a corporation of Delaware Filed Apr. 21, 1961, Ser. No. 104,731

1 Claim. (Cl. 317—100)

This invention relates to housing structures for electrical components, and more particularly to such structures for housing electronic components such as printed circuit boards.

In many electrical systems, a large number of electronic circuits are involved. In order to provide for those circuits in a minimum amount of space, various printed circuit techniques have been developed. Such printed circuits facilitate manufacture of many complicated systems such as those involved in computers. Printed circuits, in addition, provide convenient means for installing circuits at the desired locations. Furthermore, they may be made easily accessible for repairs and periodic exchange.

In many systems, especially in computers, the large number of components housed within areas as small as possible, present problems relating to proper cooling of such components. The proper cooling of such components is an important consideration which affects the performance and reliability of the circuits involved.

Housing structures for electrical components such as printed circuit boards are well known. Such electrical components often are terminated by connectors which are mounted to engage cable connectors located toward the rear of the housing structure. The connectors on the housing structure and circuit boards are arranged so that the boards may be conveniently inserted into and removed from the structure, thereby breaking or establishing electrical contacts between the circuit boards and the exterior cables.

In the past, circuit boards have generally been inserted into the housing structure in spaced relationship to each other. Supporting elements such as L shaped angle elements are generally fastened to the housing structure by means of rivets or other fastening means to provide the proper spacing for the circuit boards. The attachment of L shaped elements to the sides of the housing structure is a time consuming and expensive operation, as well as being inconvenient.

Also, because the space in housing structures is generally at a premium, especially in computer equipment, the form and dimensions of the supporting elements tend to take up much room and prevent a maximum number of the circuit boards from being installed in a given space. Furthermore, proper cooling of the circuit components becomes a problem when an unusually large number of components occupy a small space because the crowding of the components prevent proper air circulation.

It is accordingly an object of the present invention to provide an improved housing structure for electronic components.

It is a further object of this invention to provide an improved housing structure which may be manufactured relatively cheaply in large quantities.

Another object of the present invention resides in the provision of a housing structure for receiving a large number of electronic components at a relatively low cost.

It is a further object of the invention to provide an improved housing for receiving a large number of circuit components in which cooling of such components is provided by inexpensive and relatively simple means.

In accordance with the present invention, a structure for receiving a plurality of flat electrical components is provided. A substantially rectangular housing includes a plurality of partition elements. The partition elements include equally spaced protruding elements which are punched from the paritions and which form integral parts of the partitions. These elements provide supporting elements for the plurality of electrical components, which may be printed circuit boards. Apertures in the partition elements resulting from the punched out elements provides means to permit circulation of air or other cooling gases.

The foregoing objects, advantages and construction of the present invention will become more readily apparent from the following description and accompanying drawings in which:

FIGURE 1 diagrammatically illustrates an improved housing structure for electronic components in accordance with the present invention.

Figure 1:
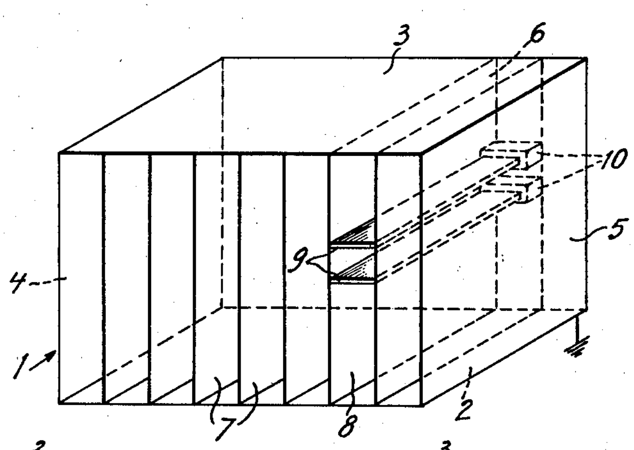

Referring particularly to FIGURE 1, a rectangular housing structure 1 includes a bottom wall 2, a top wall 3, two side walls 4 and 5 and a back wall 6. The housing structure is divided by vertical partitions 7 into a plurality of compartments 8. Each compartment 8 contains a plurality of component boards, two of which are shown in the figure and indicated by the reference numeral 9.

A plurality of electrical connectors 10 extend horizontally and are mounted on the back wall 6. The connectors 10 are arranged in vertical rows between two adjacent partitions. The connectors 10 are disposed to engage connectors associated with the component boards 9, with the connectors in turn being connected to electrical contact elements which may be included on the component boards 9. This arrangement of connectors permits a component board to be readily connected to a cable outside the housing structure 1. The details of such connectors and cables are not illustrated since they are well known to those skilled in the art and do not form a part of the present invention.

Figure 2:
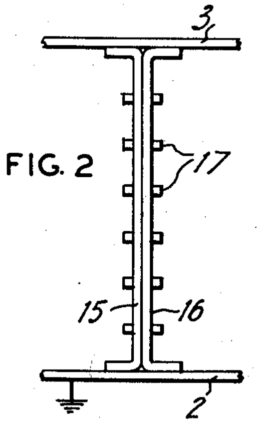
FIGURE 2 illustrates in detail a front view of a housing structure similar to one illustrated in FIGURE 1.
Figure 4:
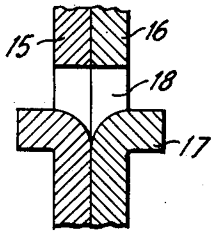
FIGURE 4 illustrates an enlarged cross-sectional view along the line 4—4 in FIGURE 3.

Referring to FIGURE 2, two partitions 15 and 16 are suitably attached in the bottom and top walls 2 and 3, respectively, of the housing structure 1. The partitions 15 and 16 are provided with a plurality of supporting elements 17 which may be punched from the main bodies of the partitions 15 and 16 to form integral parts thereof. A supporting element of one partition is aligned with a supporting element of a partition adjacent thereto. The pair of aligned supporting elements is adapted to receive and support a component board. FIGURE 4 illustrates in greater detail the supporting element 17, which forms an integral part of the partition 16.

As has been mentioned, in housing structures designed heretofore to receive a large number of printed circuit boards, the supporting means were provided as L shaped or other similar type elements which were secured to the partitions by means of screws or rivets. The present invention provides supporting elements which may be punched by a simple punch operation. Thus, by utilizing the present invention, additional parts during assembly of housing structures are not required. Also much manufacturing time may be eliminated in producing such housing structures which include supporting elements suggested by the present invention.

Referring again to FIGURE 4, a punching operation results in the supporting elements being produced in the partitions 15 and 16 at the same time an opening 18 is provided. A large number of such openings permits a cooling medium, such as air to be freely circulated. This circulation results in a cooling of the electrical components mounted onto circuit boards. Thus, in addition to providing means for inexpensively producing supporting elements in a housing structure, the present invention provides a relatively simple structure in which cooling is achieved without additional expense of manufacture.

In addition to the features of providing an inexpensive housing structure having supporting elements which include provisions for air circulation, the present invention also minimizes the amount of space required for the supporting elements. Since no screws or L shaped members are required, the maximum space between partitions may be utilized.

Figure 3:
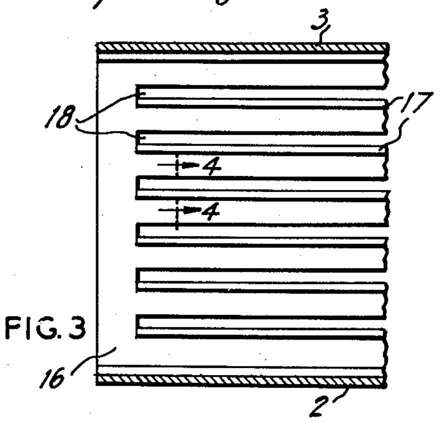
FIGURE 3 illustrates a side-view of the housing structure illustrated in FIGURE 2.

Referring particularly to FIG. 3, the supporting element 17 is illustrated as being extended along the length of the partition 16. It is realized, however, that this element may be of any size and may include series of supports resulting from small punched out holes. The particular arrangement used is dependent upon the system involved, the weight of the boards to be supported etc. Also the supporting elements may be in a staggered relationship with respect to the supporting elements on an adjacent partition.

Further the supporting elements of the same partition may protrude from both sides of the partition. For example a first, and third supporting element may protrude from the right hand side of the partition, whereas a second and forth supporting element may protrude from the left hand side of the partition. In this manner one partition may provide support for circuit boards in two adjament compartments.

Figure 5:
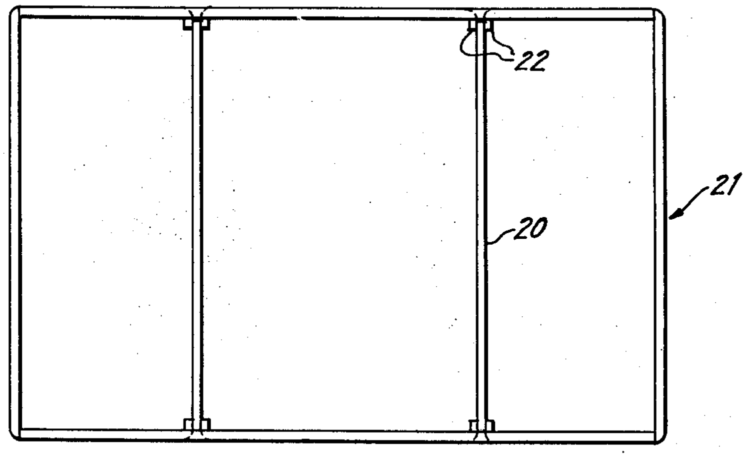
FIGURE 5 illustrates a front view of another embodiment of the present invention.

Referring particularly to FIG. 5, another embodiment of the present invention is illustrated. A plurality of circuit boards 20 which may include a number of electrical components are held in upright positions within a structure 21. Supporting elements 22, which may be similar to the elements 17 illustrated in FIGURE 3 hold the boards 20 in vertical position. Bilateral support is obtained by providing the supporting elements 22 at both sides of the circuit board 20.

What is claimed is:

An electronic component storage structure for receiving a plurality of printed circuit boards having electrical contacts comprising a substantially rectangular housing being open on one side and having two horizontal and three vertical walls, a plurality of spaced vertical members suitably mounted on said horizontal walls, a plurality of supporting elements stamped and bent perpendicularly outwardly from each of said vertical members and leaving openings in said vertical members adjacent each of said supporting elements to permit the free circulation of a cooling medium through said rectangular housing, said supporting elements being spaced with respect to each other, a plurality of horizontally extending electrical connectors mounted in a vertical row on the vertical wall facing said open side of said housing, said electrical connectors being disposed to engage said electrical contacts of said printed circuit boards.

References Cited by the Examiner

UNITED STATES PATENTS

| | | | |
|---|---|---|---|
| 1,338,101 | 4/20 | Severson | 312—350 |
| 2,843,806 | 7/58 | O'Neill | 317—100 |

JOHN F. BURNS, *Primary Examiner.*

SAMUEL BERNSTEIN, *Examiner.*